(12) United States Patent
Miyamoto

(10) Patent No.: US 8,188,645 B2
(45) Date of Patent: May 29, 2012

(54) HOT CATHODE AND ION SOURCE INCLUDING THE SAME

(75) Inventor: Naoki Miyamoto, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 240 days.

(21) Appl. No.: 12/511,660

(22) Filed: Jul. 29, 2009

(65) Prior Publication Data

US 2010/0038556 A1 Feb. 18, 2010

(30) Foreign Application Priority Data

Aug. 18, 2008 (JP) ................................. 2008-209814

(51) Int. Cl.
*H01J 9/02* (2006.01)
(52) U.S. Cl. ..................... 313/310; 250/423 R
(58) Field of Classification Search .................. 313/310, 313/346 R; 250/423 R
See application file for complete search history.

(56) References Cited

U.S. PATENT DOCUMENTS

| 2,201,819 A | * | 5/1940 | Smith ........................... 313/605 |
| 4,335,314 A | * | 6/1982 | Geerk et al. ................ 250/492.3 |
| 5,134,641 A | * | 7/1992 | Friede et al. .................. 378/122 |
| 5,793,157 A | * | 8/1998 | Takakura et al. ............. 313/446 |

FOREIGN PATENT DOCUMENTS

JP 2006-54108 2/2006

OTHER PUBLICATIONS

Machine Translation of JP 2006-54108.*

* cited by examiner

*Primary Examiner* — Toan Ton
*Assistant Examiner* — Andrew Coughlin
(74) *Attorney, Agent, or Firm* — Osha • Liang LLP

(57) ABSTRACT

A hot cathode includes: a hollow external conductor; a hollow internal conductor which is placed coaxially inside the external conductor; and a connection conductor which electrically connects tip end portions of the conductors. A heating current is folded back through the connection conductor to flow in opposite directions in the external conductor and the internal conductor.

6 Claims, 6 Drawing Sheets

HOT CATHODE AND ION SOURCE INCLUDING THE SAME

TECHNICAL FIELD

The present disclosure relates to a hot cathode which is to be used in, for example, an ion source for generating an ion beam, a plasma source for generating a plasma, or an electron beam source for generating an electron beam, and from which thermal electrons are emitted, and also to an ion source including the hot cathode.

RELATED ART

For example, Patent Reference 1 discloses a hot cathode which has a coaxial structure including: a tubular external conductor; a solid (filled or not hollowed) internal conductor (center conductor) that is placed coaxially inside the external conductor; and a connection conductor that electrically connects tip end portions of the external and internal conductors to each other, and in which the heating current is folded back through the connection conductor to flow in opposite directions in the external and internal conductors, and also an ion source including the hot cathode.

According Patent Reference 1, the hot cathode can achieve effects such as: (a) since the external and internal conductors are coaxial, and the heating current flows in opposite directions in the external and internal conductors, magnetic fields generated by the heating current flowing in the external and internal conductors cancel each other, and, in the whole hot cathode, the magnetic field generated by the flow of the heating current can be suppressed to a low level, so that thermal electrons are easily emitted; and (b) the volume of a tip end portion (i.e., the vicinity of the connection conductor) of the hot cathode or the like can be increased as compared with a known filament which is formed by a wire member (that may be called also a rod member), and hence the lifetime of the cathode can be prolonged.

[Patent Reference 1] JP-A-2006-54108 (Columns 0020, and 0022 to 0023, FIG. 2)

In the hot cathode, the internal conductor receives radiant heat from the external conductor, and the temperature of the internal conductor is largely raised as compared with that the external conductor, so that the amount of emitted thermal electrons is increased. When the heating current is increased, therefore, the temperature of the internal conductor is raised higher than the melting point of the material constituting the internal conductor, thereby causing the possibility that the internal conductor is melted down in a short time. Consequently, there is a problem in that the lifetime of the internal conductor, and therefore that of the hot cathode is short.

SUMMARY

Exemplary embodiments of the present invention provide a hot cathode and ion source including the same, which can suppress the temperature rise of an internal conductor of a hot cathode having a coaxial structure, thereby prolonging the lifetime of the internal conductor, and therefore that of the hot cathode.

A hot cathode of an exemplary embodiment of the invention is a hot cathode from which thermal electrons are emitted by flowing a heating current, wherein the hot cathode includes: a hollow external conductor; a hollow internal conductor which is placed coaxially inside the external conductor; and a connection conductor which electrically connects a tip end portion of the external conductor to a tip end portion of the internal conductor, and the heating current is folded back through the connection conductor to flow in opposite directions in the external conductor and the internal conductor.

In the hot cathode, since the internal conductor is hollow, the size of the internal conductor can be increased as compared with the case of a solid internal conductor, while suppressing increase of the mass and sectional area of the internal conductor. As a result, the concentration of heat per unit surface area in the internal conductor can be reduced, and the temperature rise of the internal conductor can be suppressed.

In place of the configuration where the tip end portions of the external and internal conductors are connected to each other by the connection conductor, the tip end portions may be electrically directly connected to each other.

The internal conductor may be made of a material which is higher in melting point than the external conductor.

An ion source of an exemplary embodiment of the invention includes the hot cathode as a cathode for generating a plasma.

According to the hot cathode of the exemplary embodiment of the invention, since the internal conductor is hollow, the size of the internal conductor can be increased as compared with the case of a solid internal conductor, while suppressing increase of the mass and sectional area of the internal conductor. As a result, the concentration of heat per unit surface area in the internal conductor can be reduced, and the temperature rise of the internal conductor can be suppressed. Therefore, the lifetime of the internal conductor, and then that of the hot cathode can be prolonged.

Moreover, the exemplary embodiment of the invention attains the following effects. Since the tip end portions of the internal and external conductors are electrically directly connected to each other without using the connection conductor, the volume of a tip end of the hot cathode can be reduced as compared with the case where the connection conductor is used. As a result, the thermal capacity of the hot cathode can be lowered, and the time constant in the temperature control can be reduced, so that the responsiveness in the temperature control can be improved.

Furthermore, the exemplary embodiment of the invention attains the following further effects. Although the temperature of the internal conductor is made higher than that of the external conductor, the internal conductor has a high heat resistance because the internal conductor is made of a material which is higher in melting point than the external conductor. Therefore, the lifetime of the internal conductor, and then that of the hot cathode can be prolonged. Furthermore, the operating range of the hot cathode can be more widened.

According to the ion source of the exemplary embodiment of the invention, since the above-described hot cathode is used as a cathode for generating a plasma, it is possible to attain the same effects as the above-described effects of the hot cathode of the exemplary embodiment of the invention.

Other features and advantages may be apparent from the following detailed description, the accompanying drawings and the claims.

DETAILED DESCRIPTION

Figure 1:
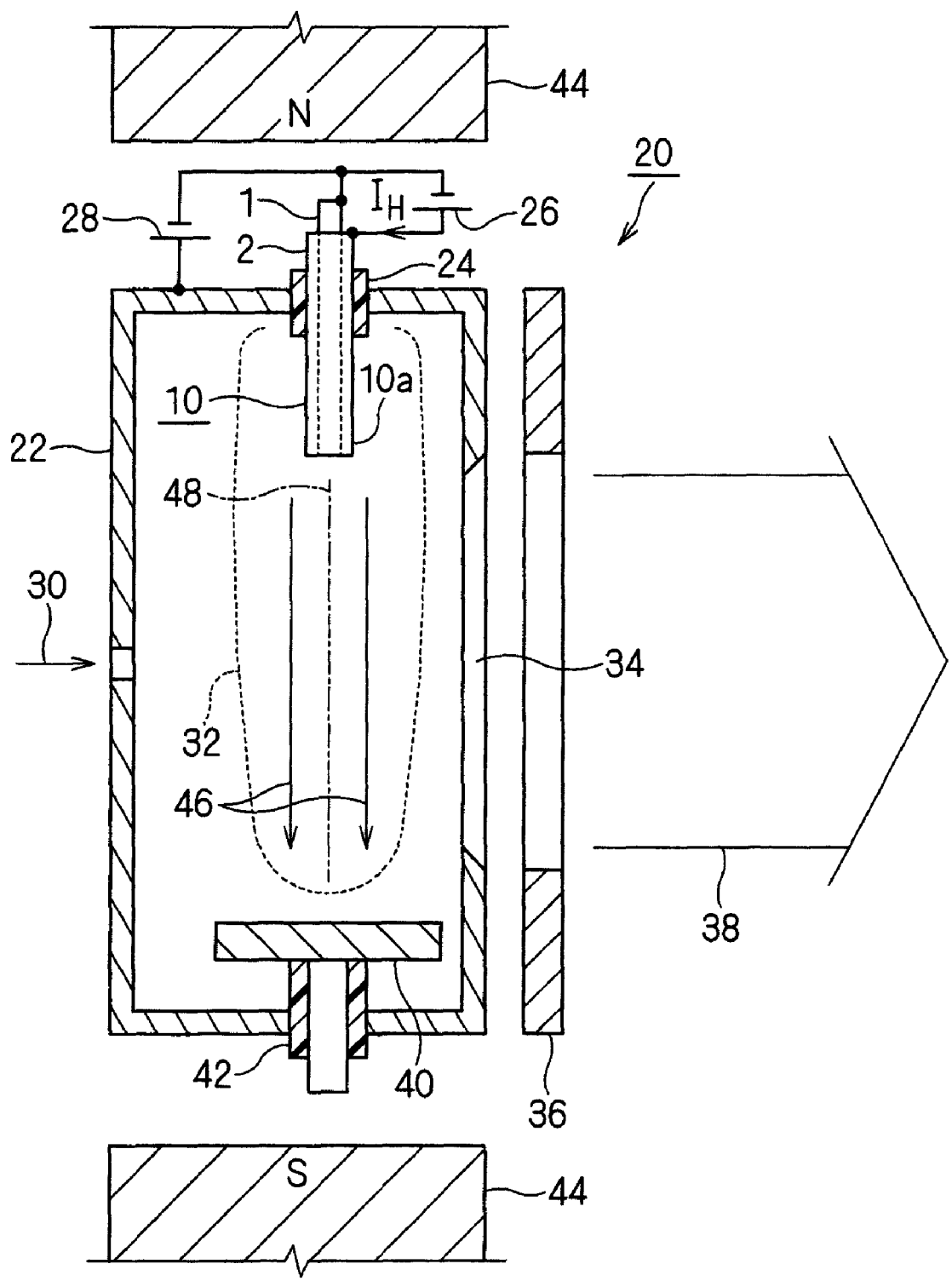
FIG. 1 is a schematic sectional view showing an embodiment of an ion source including the hot cathode of the invention.

FIG. 1 is a schematic sectional view showing an embodiment of an ion source including the hot cathode of the invention. The ion source 20 includes a hot cathode 10 as a cathode for generating a plasma 32. Namely, the ion source 20 is configured so that thermal electrons are emitted from the hot cathode 10 into a plasma generating chamber 22 functioning also as an anode, an arc discharge is produced between the hot cathode 10 and the plasma generating chamber 22, a gas (including the case of vapor) 30 introduced into the plasma generating chamber 22 is ionized to generate the plasma 32, and an ion beam 38 is extracted from the plasma 32 by an extraction electrode system 36 through an ion extraction port 34.

In the embodiment, the ion extraction port 34 has a shape which is elongated in the vertical direction in FIG. 1, so that the ion beam 38 having a ribbon-like shape can be extracted from the ion source 20. More specifically, the ion extraction port 34 in the embodiment has a slit-like shape which is elongated in the vertical direction in FIG. 1.

In the illustrated example, the extraction electrode system 36 is configured by a single electrode, but is not restricted to this. The system may be configured by a plurality of electrodes.

The hot cathode 10 has a coaxial structure comprising an external conductor 2 and internal conductor 1 which are hollow, as described later in detail with reference to FIGS. 2 to 6. In the hot cathode 10, for example, a half or more of the whole length is inserted into the plasma generating chamber 22 so as to extend along (for example, substantially parallel to) the longitudinal direction of the ion extraction port 34. In the embodiment, a portion where the hot cathode 10 is passed through the plasma generating chamber 22 is insulated by an electrical insulator 24. Without using the electrical insulator 24, alternatively, the hot cathode 10 is electrically insulated from the plasma generating chamber 22 by air space insulation (insulation due to a gap of, for example, about 1 mm or less). In longitudinal end portions of the hot cathode 10, the end portion which is located in the plasma generating chamber 22 is a tip end portion 10a.

A heating power source 26 which flows (supplies) a heating current $I_H$ is connected between the external conductor 2 and internal conductor 1 of the hot cathode 10. In the embodiment, more specifically, the heating power source 26 is a DC power source, the positive terminal of the power source is connected to the external conductor 2, and the negative terminal is connected to the internal conductor 1. The hot cathode 10, more specifically the external conductor 2 and internal conductor 1 which constitute the hot cathode (in the embodiments of FIGS. 2 and 3, also a connection conductor 3) are heated by the heating current $I_H$ to emit thermal electrons into the plasma generating chamber 22.

A DC arc power source 28 which applies a DC voltage between the hot cathode 10 (in the embodiment, specifically, the internal conductor 1) and the plasma generating chamber 22 to produce the arc discharge, thereby causing the arc current to flow is connected between them while the plasma generating chamber 22 is set as a positive side.

In the embodiment, the ion source 20 further has a reflection electrode 40 which reflects the electrons, in a portion which is in the plasma generating chamber 22, and which is opposite to the hot cathode 10. The reference numeral 42 denotes an electrical insulator. An axis 48 connecting the hot cathode 10 to the reflection electrode 40 extends along (for example, substantially parallel to) the longitudinal direction of the ion extraction port 34. In the embodiment, moreover, a magnetic field 46 in the direction along the axis 48 is applied in the plasma generating chamber 22 by a magnet 44 which is disposed outside the chamber. The direction of the magnetic field 46 may be opposite to the illustrated one.

The magnetic field 46 suppresses electrons and ions in the plasma 32 from being diffused in a direction intersecting with the magnetic field 46, thereby contributing to generation of the plasma having a high density, or in other words enhancement of the generation efficiency of the plasma 32. The reflection electrode 40 reflects electrons (thermal electrons) emitted from the hot cathode 10, and those in the plasma 32 to enhance the probability of collision between the electrons and gas molecules, thereby contributing to generation of the plasma having a high density, or in other words enhancement of the generation efficiency of the plasma 32.

Next, several embodiments of the hot cathode 10 will be described with reference to FIGS. 2 to 6.

Figure 2A:
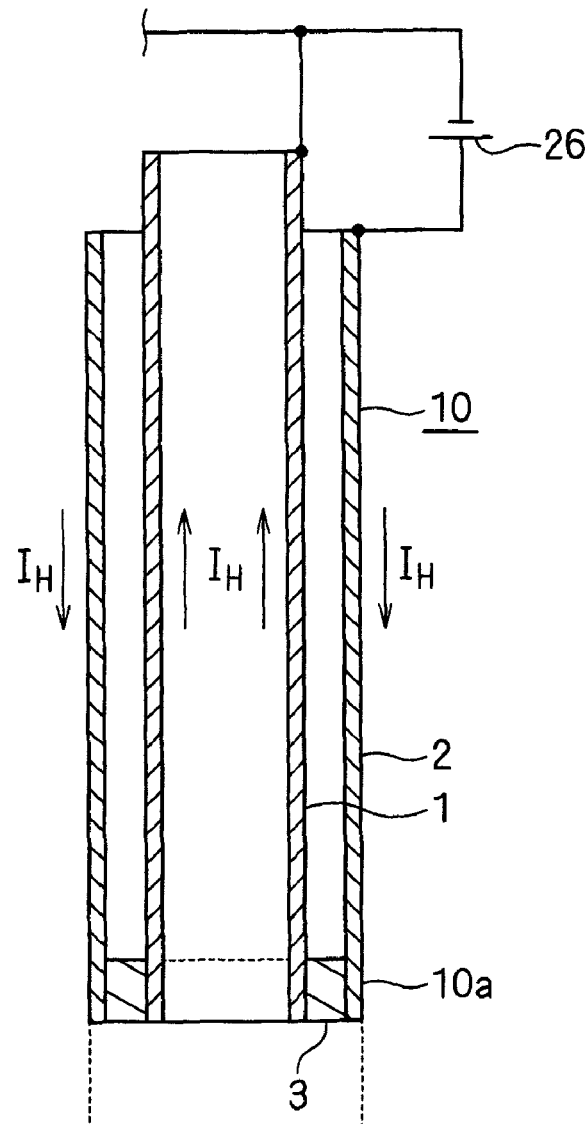
FIG. 2A is a longitudinal sectional view which shows an embodiment of the hot cathode together with a heating power source.
Figure 2B:
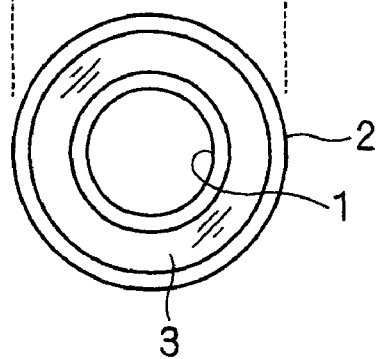
FIG. 2B is a front view as viewed from the lower side which shows the embodiment of the hot cathode together with a heating power source.

The hot cathode 10 shown in FIG. 2 includes: the hollow external conductor 2; the hollow internal conductor 1 which is placed coaxially inside the external conductor 2; and the connection conductor 3 which electrically connects a tip end portion of the external conductor 2 to a tip end portion of the internal conductor 1. The heating current $I_H$ which is supplied from the heating power source 26 is folded back through the connection conductor 3 to flow in opposite directions in the external conductor 2 and the internal conductor 1. It can be the that both the external conductor 2 and the internal conductor 1 have a tubular shape (as described below, however, the transverse section is not restricted to a circular shape). A support member which locates the internal conductor 1 in a predetermined position with respect to the external conductor 2 is not shown. This is applicable also to the other embodiments which will be described later.

In the embodiment, both the external conductor 2 and the internal conductor 1 have a circular transverse section, but are not restricted to this. Both their transverse sections may have an elliptical or polygonal shape. In view of the influence of thermal radiation which is applied to the hot cathode 10 by the components constituting the ion source 20 other than the hot cathode 10, such as the plasma generating chamber 22, the external conductor 2 and the internal conductor 1 may have transverse sectional shapes which are slightly different from each other. This is applicable also to the embodiments shown in FIGS. 3 to 5.

The connection conductor 3 has a ring-like shape. Specifically, the connection conductor in the embodiment has a circular ring-like shape, but is not restricted to this. In summary, the connection conductor is requested to have a transverse sectional shape matching the transverse sectional shapes of the external conductor 2 and the internal conductor 1.

In the embodiment, the connection conductor 3 is fittingly coupled between the tip end portions of the external conductor 2 and the internal conductor 1. The couplings between the connection conductor 3, and the external conductor 2 and the internal conductor 1 may be performed by only coupling due to fitting, or by a combination of fitting and welding. When welding is combinedly used, the reliability of the coupling is improved.

Preferably, the external conductor 2, the internal conductor 1, and the connection conductor 3 are made of a high-melting point metal such as molybdenum (melting point: 2,896K), tantalum (melting point: 3,290K), tungsten (melting point: 3,695K), rhenium (melting point: 3,459K), or iridium (melting point: 2,739K), or a high-melting point material such as an alloy containing two or more of these metals. This is applicable also to the embodiments shown in FIGS. 3 to 5.

In the hot cathode 10, since the internal conductor 1 is hollow, the size (for example, the outer diameter) of the internal conductor 1 can be increased as compared with the case of a solid internal conductor, while suppressing increase of the mass and sectional area of the internal conductor 1. As a result, the concentration of heat per unit surface area in the internal conductor 1 can be reduced, and the temperature rise of the internal conductor 1 can be suppressed. Therefore, the lifetime of the internal conductor 1, and then that of the hot cathode 10 can be prolonged.

A case is assumed where the internal conductor is not formed as a hollow member, but configured as a rod member which is simply solid, and which has a large diameter, or an assembly of rods which are solid, and which have a small diameter. In this case, there are disadvantages such as: (a) since the mass of the internal conductor is large and the heat capacity is large, the time constant in the temperature control is increased and the responsiveness of the hot cathode 10 in the temperature control is lowered; and (b) since the sectional area of the internal conductor is increased and the electrical resistance is lowered, the electrical power which can be supplied to the hot cathode is reduced and the temperature of the hot cathode 10 is not sufficiently raised. When the internal conductor 1 is formed to be hollow, by contrast, such disadvantages can be prevented from occurring.

Figure 6:
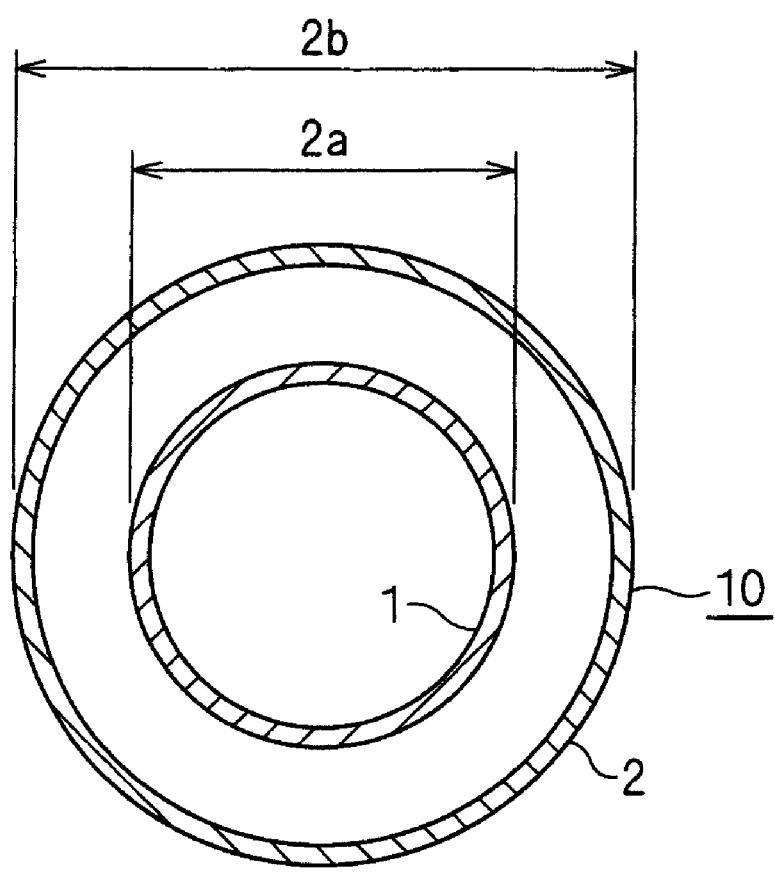
FIG. 6 is a transverse sectional view showing an example of external and internal conductors of the hot cathode.

The temperature of the internal conductor 1 will be described by means of an expression and using a model shown in FIG. 6. In the description, the temperature gradient in the axial direction of the hot cathode 10 is neglected.

In this case, in accordance with a known relational expression in the case where two bodies having a sufficiently large area as compared with the gap exchange radiation (for example, see KITAMURA Kenzo, OOTAKE Kazutomo, "KISO DENNETSU KOGAKU", First edition, KYORITSU SHUPPAN KABUSHIKI KAISHA, Dec. 25, 1991, pp. 146-148), net radiation heat $Q_1$ (i.e., in which the heat quantity absorbed by the internal conductor 1 is subtracted from that radiated from the internal conductor 1) of the internal conductor 1 can be expressed by Exp 1. In the expression, a and b are the radii of the cylindrical internal and external conductors 1 and 2 (the thickness is neglected), $E_1$ and $E_2$ are emission energies of the internal and external conductors 1 and 2, $\epsilon_1$ and $\epsilon_2$ are emissivities of the internal and external conductors 1 and 2, $T_1$ and $T_2$ are temperatures of the internal and external conductors 1 and 2, and a is the Stefan-Boltzmann constant.

$$Q_1 = \frac{E_1 \varepsilon_2 - E_2 \varepsilon_1}{\varepsilon_1 + \varepsilon_2 - \varepsilon_1 \varepsilon_2} \qquad \text{[Exp. 1]}$$
$$= \frac{2\pi \varepsilon_1 \varepsilon_2 \sigma}{\varepsilon_1 + \varepsilon_2 - \varepsilon_1 \varepsilon_2}(aT_1^4 - bT_2^4)$$

When it is assumed that the radiation equilibrium (the state where the heat quantity radiated from the internal conductor 1 is equal to that absorbed by the internal conductor 1) is attained in the internal conductor 1 and the temperature of the internal conductor 1 is maintained in equilibrium, $Q_1=0$ can be set in the above expression. From this and Exp. 1, following Exp. 2 can be obtained, and then Exp. 3 can be obtained. This allows the temperature $T_1$ of the internal conductor 1 to be obtained.

$$\frac{a}{b} = \left(\frac{T_2}{T_1}\right)^4 \qquad \text{[Exp. 2]}$$

$$T_1 = \sqrt[4]{\frac{b}{a}} \cdot T_2 \qquad \text{[Exp. 3]}$$

From Exp. 3 above, it is known that, when the radius a of the internal conductor 1 is increased (under the conditions that the radius is smaller than the radius b of the external conductor 2 and a gap required for electrical insulation can be ensured), the temperature $T_1$ can be lowered. Specifically, it is known that, when the radius a of the internal conductor 1 is made close to the radius b of the external conductor 2, the temperature $T_1$ of the internal conductor 1 becomes close to the temperature $T_2$ of the external conductor 2.

For example, it is assumed that the internal conductor 1 and the external conductor 2 are made of tungsten (melting point: 3,695K), and the temperature $T_2$ of the external conductor 2 in the case where a required amount of thermal electrons is obtained is 3,000K.

In this case, when it is assumed that the radius b of the external conductor 2 is 2.5 mm, and the internal conductor 1 is made solid as in the related-art example and the radius a is 1.0 mm, $T_1=1.257\times3,000=3,771$ [K] is obtained from Exp. 3 above, and exceeds the melting point of tungsten.

By contrast, when the radius b of the external conductor 2 is similarly set to be 2.5 mm, and, in accordance with the invention, the internal conductor 1 is made hollow (tubular) and the radius is 2.0 mm, $T_1=1.057\times3,000=3,171$ [K] is obtained from Exp. 3 above, and sufficiently lower than the melting point of tungsten.

Referring again to FIGS. 1 and 2, the hot cathode 10 further achieves the following effects. Since the external and internal conductors 2 and 1 are coaxial, and the heating current $I_H$ flows in opposite directions in the external and internal conductors 2 and 1, magnetic fields generated by the heating current $I_H$ flowing in the conductors 1 and 2 cancel each other, and, in the whole hot cathode 10, the magnetic field generated by the flow of the heating current $I_H$ can be suppressed to a low level. Therefore, thermal electrons are hardly captured by the magnetic field, and hence thermal electrons are easily emitted.

In the ion source 20 including the thus configured hot cathode 10, the degree by which the magnetic field 46 applied into the plasma generating chamber 22 by the magnet 44 is disturbed by the magnetic field generated by the hot cathode 10 can be suppressed to a low level. As in the example shown in FIG. 1, therefore, the high-density columnar plasma 32 which extends along the ion extraction port 34, and which is considerably sharp can be generated in the plasma generating chamber 22. As a result, the ion beam 38 can be efficiently extracted from the plasma 32 through the ion extraction port 34, and hence the beam current of the ion beam 38 is easily increased.

By contrast, in the case where a known U-like filament is disposed in place of the hot cathode 10, although not illustrated, a strong magnetic field is generated in a wide range by flowing a heating current through the filament, to largely disturb the magnetic field 46. Therefore, the plasma 32 is largely expanded in the plasma generating chamber 22, and the density of the plasma is lowered. As a result, the beam current of the ion beam 38 is significantly reduced as compared with the case where the hot cathode 10 is used.

In the hot cathode 10, moreover, the volume of the tip end portion 10a (i.e., the vicinity of the connection conductor 3) of the hot cathode 10 or the like can be increased as compared with a known filament which is formed by a wire member (that may be called also a rod member, the same shall apply hereinafter), and hence the lifetime of the hot cathode 10 can be prolonged.

Next, the other embodiments of the hot cathode 10 will be described while the portions which are identical or corresponding to those of the embodiment shown in FIG. 2 are denoted by the same reference numerals, and emphasis is placed on differences from the embodiment shown in FIG. 2.

Figure 3A:
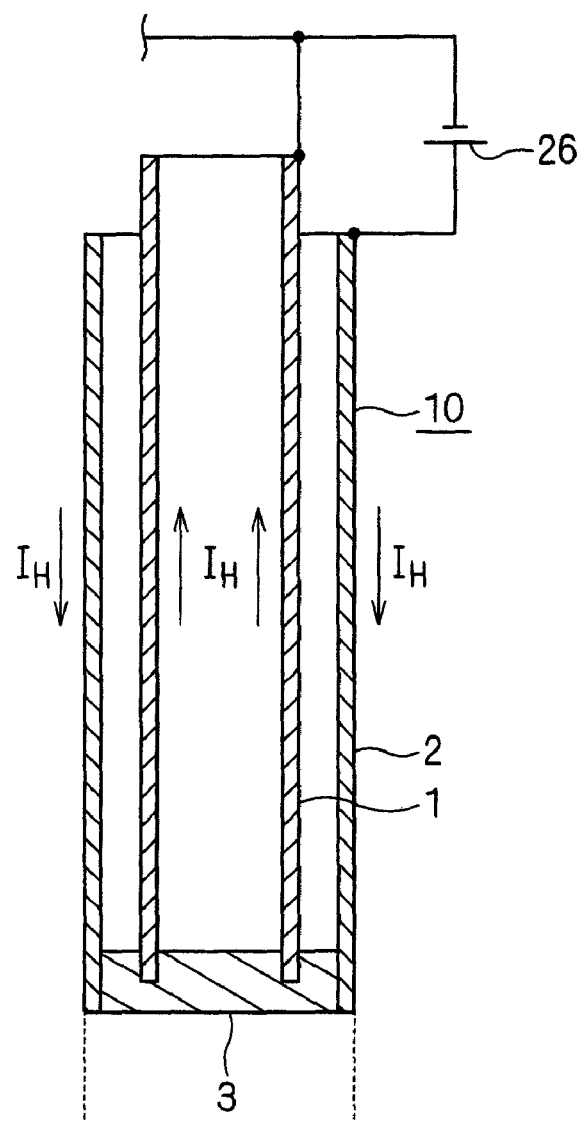
FIG. 3A is a longitudinal sectional view which shows another embodiment of the hot cathode together with a heating power source.
Figure 3B:
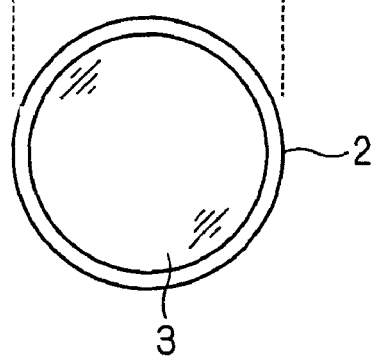
FIG. 3B is a front view as viewed from the lower side which shows another embodiment of the hot cathode together with a heating power source.

In the hot cathode 10 shown in FIG. 3, a tip end portion of the external conductor 2 and that of the internal conductor 1 are electrically connected to each other by a plate-like connection conductor 3. In the embodiment, the plan shape of the connection conductor 3 is circular (i.e., the connection conductor 3 has a disk-like shape), but is not restricted to this. In summary, the connection conductor is requested to match with the transverse sectional shapes of the external and internal conductors 2 and 1.

In the embodiment, the connection conductor 3 is fittingly coupled to the tip end portions of the external conductor 2 and the internal conductor 1. Namely, the connection conductor 3 is fitted so as to cover the tip end portion of the internal conductor 1, and fitted into the tip end portion of the external conductor 2. The couplings between the connection conductor 3, and the external conductor 2 and the internal conductor 1 may be performed by only coupling due to fitting, or by a combination of fitting and welding. When welding is combinedly used, the reliability of the coupling is improved.

Figure 4A:
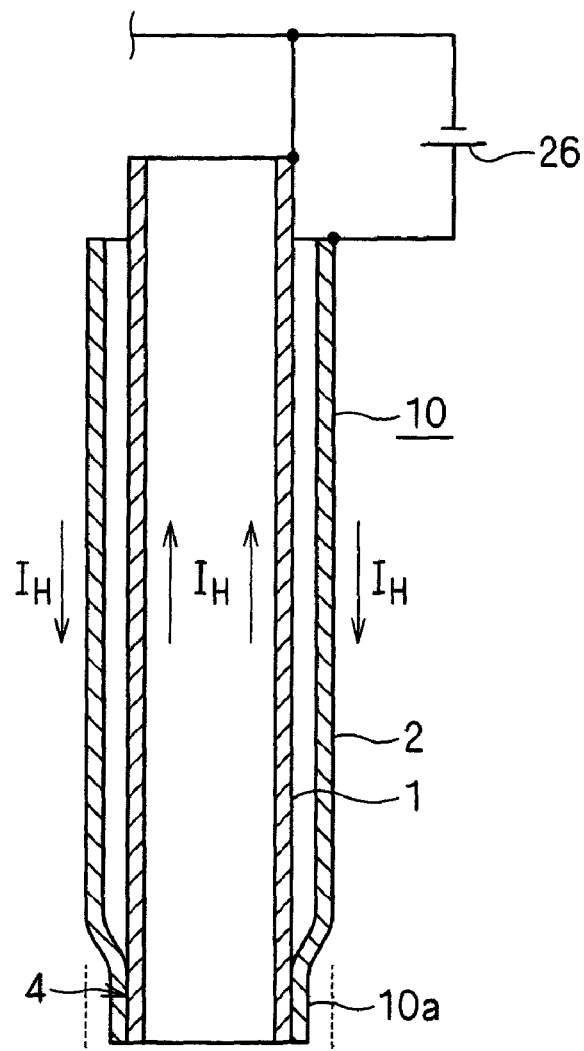
FIG. 4A is a longitudinal sectional view which shows a further embodiment of the hot cathode together with a heating power source.
Figure 4B:
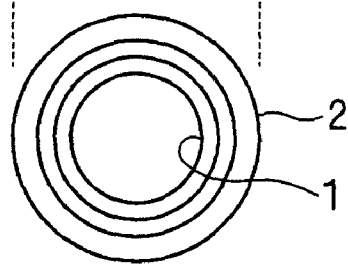
FIG. 4B is a front view as viewed from the lower side which shows the further embodiment of the hot cathode together with a heating power source.
Figure 5A:
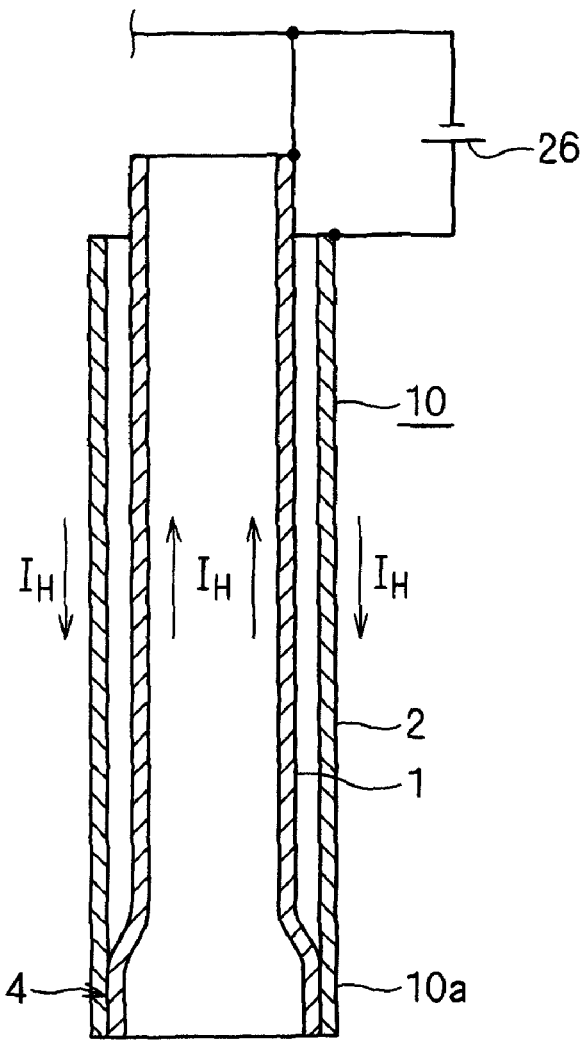
FIG. 5A is a longitudinal sectional view which shows a still further embodiment of the hot cathode together with a heating power source.
Figure 5B:
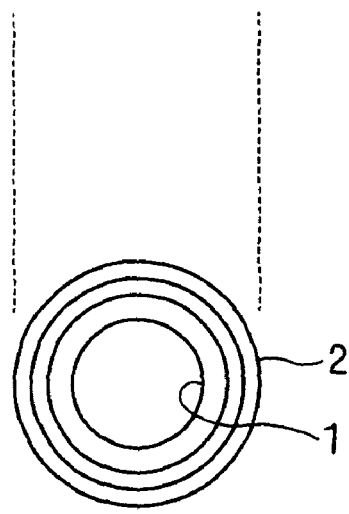
FIG. 5B is a front view as viewed from the lower side which shows the still further embodiment of the hot cathode together with a heating power source.

In hot cathodes 10 shown in FIGS. 4 and 5, the tip end portions of the external conductor 2 and the internal conductor 1 are electrically directly connected to each other without using the connection conductor 3.

Specifically, in the hot cathode 10 shown in FIG. 4, the tip end portion of the external conductor 2 is inwardly contracted to be contacted with the tip end portion of the internal conductor 1, thereby forming a connecting portion 4 which electrically connects the tip end portions together.

In the hot cathode 10 shown in FIG. 5, the tip end portion of the internal conductor 1 is outwardly expanded to be contacted with the tip end portion of the external conductor 2, thereby forming a connecting portion 4 which electrically connects the tip end portions together.

In each of the connecting portions 4, the coupling between the tip end portions of the conductors 1 and 2 may be performed by only coupling due to fitting, or by a combination of fitting and welding. When welding is combinedly used, the reliability of the coupling is improved.

The hot cathodes 10 shown in FIGS. 2 to 5 will be compared with one another in the viewpoint of the responsiveness of the above-described hot cathode 10 in the temperature control. In the hot cathodes 10 shown in FIGS. 4 and 5, since the tip end portions of the external conductor 2 and the internal conductor 1 are electrically directly connected to each other without using a connection conductor, the volume of the tip end portion 10a of the hot cathode 10 can be reduced as compared with the hot cathodes 10 of FIGS. 2 and 3 in which the connection conductor 3 is used. As a result, the thermal capacity of the hot cathodes 10 can be lowered, the time constant in the temperature control can be reduced, so that the responsiveness in the temperature control can be improved.

When the hot cathodes 10 of FIGS. 2 and 3 in both of which the connection conductor 3 is used are compared to each other, the hot cathode 10 of FIG. 2 has higher responsiveness because the mass of the connection conductor 3 is smaller and the heat capacity is smaller. Even the hot cathode 10 of FIG. 3, however, responsiveness is higher than an indirectly-heated cathode in which the cathode is heated by a filament.

The differences among the hot cathodes 10 with respect to responsiveness in the temperature control are within the range of, for example, about 1 to 2 seconds. In the case where the ion source 20 having one of the hot cathodes 10 is used in an ion implanting apparatus or the like, it is often that the ion source 20 is activated and deactivated many times (for example, in the order of several tens of times, the same shall apply hereinafter) a day in order to change the implantation conditions many times a day. In such a case, the above-described responsiveness of the hot cathode 10 affects the throughput of the ion implanting apparatus. Therefore, higher responsiveness of the hot cathode 10 is more preferable.

In the case of the hot cathodes 10 shown in FIGS. 4 and 5, as compared with the hot cathodes 10 shown in FIGS. 2 and 3, the volume of the tip end portion 10a is smaller by a degree corresponding to the configuration where the connection conductor 3 is not used, and slightly more disadvantageous from the viewpoint of lifetime. However, this can be compensated for to some extent by, for example, axially extending the connecting portion 4. The volume of the tip end portion 10a can be made larger than a known filament which is formed by a wire member. Therefore, the lifetime of the hot cathode 10 can be prolonged.

In all of the above-described embodiments, the internal conductor 1 may be made of a material which is higher in melting point than the external conductor 2. As seen also from Exp. 3 above, the temperature of the internal conductor 1 is always higher than that of the external conductor 2. When the internal conductor 1 is made of a material which is higher in melting point than the external conductor 2, therefore, the internal conductor 1 has a high heat resistance, so that the lifetime of the internal conductor, and then that of the hot cathode can be prolonged. Furthermore, the operating range of the hot cathode 10 can be more widened.

Tables 1 and 2 show examples of combinations of materials among those described above, the combinations satisfying the relationship that the melting point of the internal conductor 1 is higher than that of the external conductor 2. Table 1 shows the case where the connection conductor 3 is disposed, and Table 2 shows the case where the connection conductor 3 is not disposed. It will be appreciated that these are mere examples, and that materials other than those shown here can be used.

Tables 1 and 2 show also a preferred sequence of the combinations from the viewpoints of the lifetime of the hot cathode 10 and the like (i.e., from the viewpoints of prolonging of the lifetime of the hot cathode 10 and broadening of the operating range of the hot cathode 10 as described above), and that from the viewpoints of these aspects and workability of the material (i.e., the easiness of working). A smaller number indicates a more preferred order. It will be appreciated that these sequences are mere examples, and the invention is not bound to the sequences.

TABLE 1

| Combination | External conductor 2 | Internal conductor 1 | Connection conductor 3 | Preferred sequence in view of lifetime, etc. | Preferred sequence in view also of workability |
|---|---|---|---|---|---|
| A | tantalum | tungsten | tantalum | 2 | 1 |
| B | tantalum | tungsten | tungsten | 1 | 2 |
| C | tantalum | rhenium | tantalum | 4 | 3 |
| D | tantalum | rhenium | rhenium | 3 | 4 |
| E | rhenium | tungsten | tungsten | 5 | 11 |
| F | rhenium | tungsten | rhenium | 6 | 12 |
| G | molybdenum | tungsten | tungsten | 7 | 8 |
| H | molybdenum | tungsten | molybdenum | 8 | 7 |
| I | molybdenum | rhenium | rhenium | 9 | 10 |
| J | molybdenum | rhenium | molybdenum | 10 | 9 |
| K | molybdenum | tantalum | tantalum | 11 | 5 |
| L | molybdenum | tantalum | molybdenum | 12 | 6 |

TABLE 2

| Combination | External conductor 2 | Internal conductor 1 | Preferred sequence in view of lifetime, etc. | Preferred sequence in view also of workability |
|---|---|---|---|---|
| A | rhenium | tungsten | 1 | 6 |
| B | tantalum | tungsten | 2 | 1 |
| C | molybdenum | tungsten | 4 | 5 |
| D | tantalum | rhenium | 3 | 2 |
| E | molybdenum | rhenium | 5 | 4 |
| F | molybdenum | tantalum | 6 | 3 |

The ion source 20 shown in FIG. 1 includes the hot cathode 10 described in the embodiments, as the cathode for generating the plasma 32, and therefore can achieve the same effects as those attained by the hot cathode 10 of the embodiments.

However, the hot cathode 10 can be applied also to ion sources other than the ion source 20 shown in FIG. 1, such as an ion source which does not have the reflection electrode 40, and that which includes a plurality of hot cathodes. Furthermore, the hot cathode 10 can be applied also to apparatuses other than an ion source, such as a plasma source which generates a plasma by using thermal electrons emitted from the hot cathode 10, and an electron beam source which generates an electron beam by using thermal electrons emitted from the hot cathode 10.

What is claimed is:

1. A hot cathode comprising:
a hollow external conductor;
a hollow internal conductor which is placed coaxially inside said external conductor, wherein said internal conductor is made of a material which is higher in melting point than said external conductor; and
a connection conductor which electrically connects a tip end portion of said external conductor to a tip end portion of said internal conductor,
wherein a heating current is folded back through said connection conductor to flow in opposite directions in said external conductor and said internal conductor in order to emit thermal electrons, and
wherein the hot cathode is configured to be a cathode for a plasma generating chamber, and
wherein the plasma generating chamber is configured as an anode.

2. A hot cathode according to claim 1, wherein said connection conductor has a ring-like shape.

3. A hot cathode according to claim 1, wherein said connection conductor has a plate-like shape.

4. A hot cathode comprising:
a hollow external conductor; and
a hollow internal conductor which is placed coaxially inside said external conductor, wherein said internal conductor is made of a material which is higher in melting point than said external conductor, and
wherein a tip end portion of said external conductor is electrically directly connected to a tip end portion of said internal conductor, and
wherein a heating current is folded back at a connecting portion between said external conductor and said internal conductor, to flow in opposite directions in said external conductor and said internal conductor in order to emit thermal electrons, and
wherein the hot cathode is configured to be a cathode for a plasma generating chamber, and
wherein the plasma generating chamber is configured as an anode.

5. A hot cathode according to claim 4, wherein the tip end portion of said external conductor is inwardly contracted to be contacted with the tip end portion of said internal conductor to form the connecting portion.

6. A hot cathode according to claim 4, wherein the tip end portion of said internal conductor is outwardly expanded to be contacted with the tip end portion of said external conductor to form the connecting portion.

* * * * *